(12) United States Patent  
Ward

(10) Patent No.: US 9,520,285 B2
(45) Date of Patent: Dec. 13, 2016

(54) SILICON CARBIDE EPITAXY

(71) Applicant: Anvil Semiconductors Limited, Warwickshire (GB)

(72) Inventor: Peter Ward, Cambridgeshire (GB)

(73) Assignee: Anvil Semiconductors Limited, Warwickshire (GB)

( * ) Notice: Subject to any disclaimer, the term of this patent is extended or adjusted under 35 U.S.C. 154(b) by 0 days.

(21) Appl. No.: 14/350,916

(22) PCT Filed: Oct. 23, 2012

(86) PCT No.: PCT/GB2012/052627
§ 371 (c)(1),
(2) Date: Apr. 10, 2014

(87) PCT Pub. No.: WO2013/061047
PCT Pub. Date: May 2, 2013

(65) Prior Publication Data
US 2015/0206743 A1 Jul. 23, 2015

(30) Foreign Application Priority Data

Oct. 26, 2011 (GB) .................................. 1118502.2

(51) Int. Cl.
*H01L 29/15* (2006.01)
*H01L 21/02* (2006.01)
(Continued)

(52) U.S. Cl.
CPC ..... *H01L 21/02529* (2013.01); *H01L 21/0262* (2013.01); *H01L 21/02381* (2013.01); *H01L 21/02447* (2013.01); *H01L 21/02642* (2013.01);
(Continued)

(58) Field of Classification Search
CPC .................. H01L 21/02378; H01L 21/02433; H01L 21/02488; H01L 21/02499; H01L 21/02502; H01L 21/02516; H01L 21/02529
See application file for complete search history.

(56) References Cited

U.S. PATENT DOCUMENTS

| 6,342,404 B1 | 1/2002 | Shibata et al. | |
| 2003/0036247 A1* | 2/2003 | Eriksen et al. | 438/455 |
| 2010/0189981 A1* | 7/2010 | Poblenz et al. | 428/220 |

FOREIGN PATENT DOCUMENTS

| CN | 101069264 A | 11/2007 |
| JP | 55-098823 A | 7/1980 |

(Continued)

OTHER PUBLICATIONS

International Preliminary Report on Patentability for corresponding International Application No. PCT/GB2012/052627 mailed May 8, 2014.
(Continued)

*Primary Examiner* — Marc Armand
*Assistant Examiner* — Sarah Salerno
(74) *Attorney, Agent, or Firm* — Renner, Otto, Boisselle & Sklar, LLP

(57) ABSTRACT

A method comprises providing a monocrystalline silicon wafer (11) having a principal surface (17) which supports a masking layer (24), for example silicon dioxide or polycrystalline silicon, having windows (25) to expose corresponding regions of the silicon wafer, forming silicon carbide seed regions (30) on the exposed regions of the wafer, for example by forming carbon and converting the carbon into silicon carbide, and growing monocrystalline silicon carbide (31) on the silicon carbide seed regions. Thus, monocrystalline silicon carbide can be formed selectively on the silicon wafer which can help to avoid wafer bow.

24 Claims, 5 Drawing Sheets

(51) Int. Cl.
| | |
|---|---|
| H01L 29/66 | (2006.01) |
| H01L 29/739 | (2006.01) |
| H01L 29/04 | (2006.01) |
| H01L 29/16 | (2006.01) |
| H01L 29/74 | (2006.01) |
| H01L 21/308 | (2006.01) |

(52) U.S. Cl.
CPC ..... *H01L 21/02645* (2013.01); *H01L 21/3081* (2013.01); *H01L 29/045* (2013.01); *H01L 29/1608* (2013.01); *H01L 29/66068* (2013.01); *H01L 29/66363* (2013.01); *H01L 29/7393* (2013.01); *H01L 29/7395* (2013.01); *H01L 29/74* (2013.01)

(56) References Cited

FOREIGN PATENT DOCUMENTS

| | | |
|---|---|---|
| JP | 56-150880 A | 11/1981 |
| JP | 63-260014 A | 10/1988 |
| JP | 10-081599 A | 3/1998 |
| JP | 2000-286450 A | 10/2000 |
| WO | WO 2006/060339 A2 | 6/2006 |

OTHER PUBLICATIONS

International Search Report for corresponding International Application No. PCT/GB2012/052627 mailed Apr. 23, 2013.
Edgar et al., "Selective epitaxial growth of silicon carbide on SiO2 masked Si(100): The effects of temperature", Journal of Applied Physics, American Institute of Physics, New York, NY, US, vol. 84, No. 1, Jul. 1, 1998, pp. 201-204, XP012045156.
Wu et al., "A comparison of SiO2 and Si3N4 masks for selective epitaxial growth of 3C—SiC films on Si", Materials Science Forum, Trans Tech Publications Ltd., Switzerland, vol. 353-356, Jan. 1, 2001, pp. 171-174, XP009166208.
Nishino et al., "Lateral over-growth of 3C—SiC on patterned Si(111) substrates", Journal of Crystal Growth, Elsevier, Amsterdam, NL, vol. 237-239, Apr. 1, 2002, pp. 1250-1253, XP004355976.
K. Teker, Selective epitaxial growth of 3C—SiC on patterned Si using hexamethyldisilane by APCVC, Journal of Crystal Growth, Elseiver, Amsterdam, NL, vol. 257, No. 3-4, Oct. 1, 2003, pp. 245-254, XP004452937.
Gupta et al., "Selective epitaxy and lateral overgrowth of 3C—SiC on Si—A review", Progress in Crystal Growth and Characterization of Materials, Elsevier Publishing, Barking, GB, vol. 51, No. 1-3, Jan. 1, 2005, pp. 43-69, XP027827904.
Gwo et al., "Selective-area chemical-vapor deposition of Si using a bilayer dielectric mask patterned by proximal probe oxidation", Journal of Vacuum Science and Technology; Part A, AVS/AIP, Melville, NY, US, vol. 19, No. 4, Jul. 1, 2001, pp. 1806-1811, XP012005718.
Office Action for corresponding European Application No. 12780270.0 mailed Jul. 10, 2015.
Office Action for related Chinese Application No. 201280052855.8 dated Feb. 29, 2016.
Office Action for related Singapore Application No. 112014011848 dated Apr. 19, 2016.
Office Action for related Japanese Application No. 2014-537716 dated May 17, 2016.

\* cited by examiner

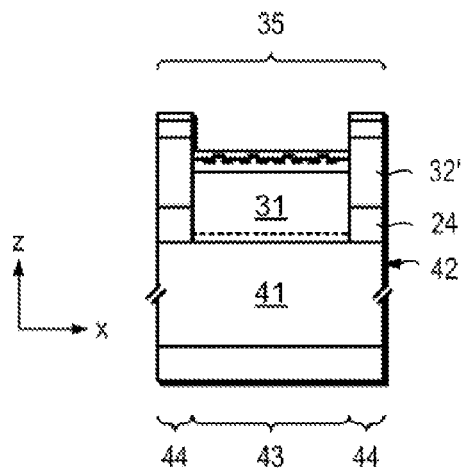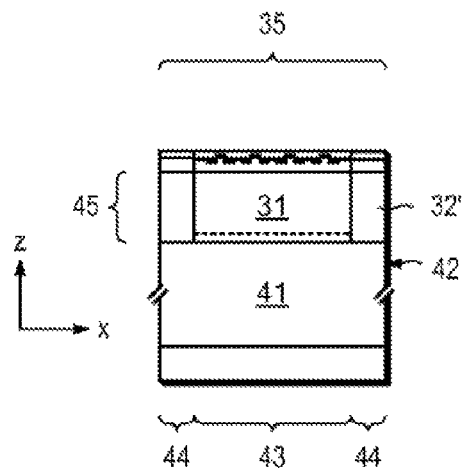
Fig. 4a     Fig. 4b
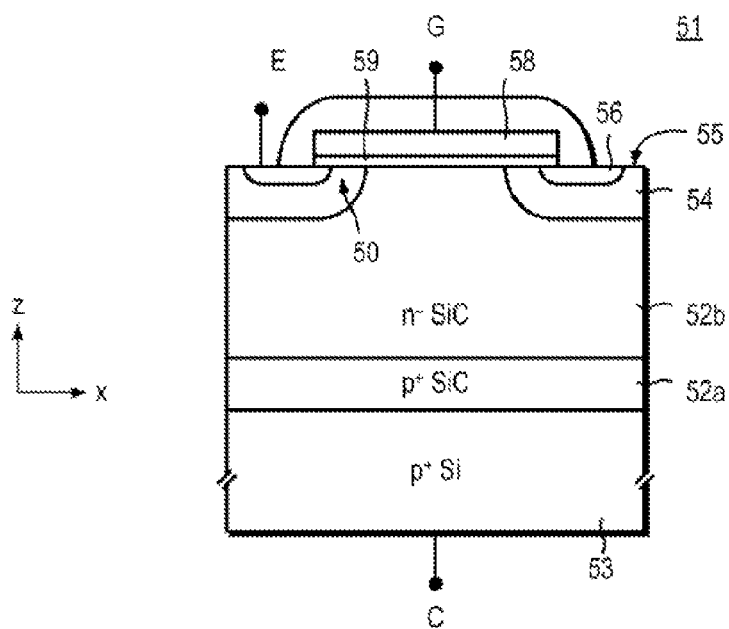
Fig. 5

SILICON CARBIDE EPITAXY

FIELD OF THE INVENTION

The present invention relates to silicon carbide epitaxy.

BACKGROUND

Silicon carbide is a promising material for future power electronics applications because it can sustain much higher voltages than silicon and has a thermal conductivity similar to copper.

Silicon carbide exists in several different crystal forms (or "polytypes") depending on the sequence in which bilayers of silicon and carbon stack.

The most commonly-used polytype of silicon carbide is four-step hexagonal stacking sequence silicon carbide (4H-SiC) because it is possible to grow this in single crystal form and produce wafers of the semiconductor material. However, these crystals are produced by physical vapour transport (PVT) process in which a powder of silicon carbide is sublimed at about 2,200° C. producing a vapour which travels and then condenses on a seed crystal. This process is very energy intensive and so silicon carbide wafers are much more expensive to produce than silicon wafers.

Another polytype of silicon carbide, 3-step cubic silicon carbide (3C-SiC), can in principle be grown epitaxially on silicon wafers because they share a cubic crystal form. In this case, a layer of silicon carbide for device fabrication could be realised more cheaply than fabricating a 4H-SiC wafer. However, there are two significant challenges to epitaxially growing a layer of 3-step cubic silicon carbide on silicon, i.e. 3C-SiC/Si heteroepitaxy.

Firstly, there is a lattice mismatch between 3-step cubic silicon carbide and the silicon wafer seed.
Case: 63836PCT1

Secondly, silicon carbide and silicon have different coefficients of thermal expansion. When a layer of silicon carbide is grown on silicon at elevated temperatures and then cooled to room temperature, the silicon carbide contracts at a faster rate than silicon, thus the resulting structure bows.

When growing indium gallium aluminium nitride (InGaAlN) on a sapphire or silicon carbide substrate, warping or cracking can be reduced by forming a layer of silicon dioxide on the substrate and selectively growing InGaAlN through openings in the silicon dioxide layer on the exposed parts of the substrate, as described in JP 10 135140 A. InGaAlN is generally grown at temperatures of no more than about 600° C. which is well below the melting point of the substrate. However, silicon carbide is generally grown at temperatures in excess of 1200° C. Furthermore, silicon carbide is grown using gas mixtures which etch silicon dioxide at such high temperatures.

Attempts have been made to address the problem of cracking in layers of silicon carbide by growing silicon carbide on a single-crystal silicon-germanium substrate having a Ge content of between 5 and 20%, as described in WO 03069657 A.

SUMMARY

The present invention seeks to address the problem of wafer bow and/or other mechanical deficiencies when growing silicon carbide on silicon particularly having an interface over extended distances (for example, more than 1 mm) for fabricating a silicon carbide-on-silicon semiconductor device which includes one or more vertical-type transistors.

According to a first aspect of the present invention there is provided a method comprising providing a monocrystalline silicon wafer having a principal surface which supports a masking layer having windows which expose corresponding regions of the silicon wafer, forming silicon carbide seed regions on the exposed regions of the wafer and growing monocrystalline silicon carbide on the silicon carbide seed regions. The term "silicon wafer" is intended to exclude a silicon-germanium wafer.

This method can help to reduce bow-causing forces across the silicon wafer resulting from differences in thermal expansion for silicon carbide and silicon. Furthermore, regions of polycrystalline and/or amorphous silicon carbide may be formed between the monocrystalline silicon carbide layers which can help to reduce stress and, thus, contribute to reducing bow-causing forces.

Forming the silicon carbide seed regions preferably comprises forming a respective silicon carbide seed layer on each exposed region. Forming the silicon carbide layers preferably comprises growing a respective monocrystalline silicon carbide layer on each silicon carbide seed region.

Providing the silicon wafer having a principal surface which supports a masking layer may comprise providing the silicon wafer, forming a masking layer on the silicon wafer such that the masking layer directly overlies the principal surface, providing an etch mask having windows on the masking layer and etching the masking layer through the windows in the etch mask to reach the principal surface of the wafer.

The masking layer may comprise a dielectric layer. The dielectric layer may be a silicon dioxide layer. The silicon dioxide layer may be a thermal oxide layer or a deposited silicon dioxide layer. The masking layer may comprise a bilayer comprising first and second bilayer layers, for example, a layer of silicon dioxide (closest to the wafer) and a layer of silicon nitride (furthest from the wafer). The masking layer may have a thickness in a range between 2,000 and 10,000 Å, for example, in a range between 4,000 and 6,000 Å. The principal surface may be a first principal surface and the masking layer may be a first masking layer and the silicon wafer may have a second, opposite principal surface which supports a second masking layer. The second masking layer preferably is not patterned. The presence of a masking layer on the back of the wafer can help to stiffen the wafer. The first masking layer and the second masking layer may comprise the same material, for example silicon dioxide. The masking layer may comprise a semiconductor layer. The semiconductor may be polycrystalline silicon.

The masking layer may be subsequently partially or fully etched by feed gases at elevated temperatures while in a reactor chamber. Even though the masking layer may be partially or fully consumed, the masking layer can still serve to prevent or inhibit monocrystalline silicon carbide from being grown on an underlying region of silicon, for example, by causing polycrystalline and/or amorphous silicon carbide to be formed between the monocrystalline silicon carbide layers.

The monocrystalline silicon carbide layers and the polycrystalline and/or amorphous silicon carbide region(s) may be coplanar (i.e. formed in the same layer). The monocrystalline silicon carbide layers and the polycrystalline and/or amorphous silicon carbide regions may lie in different planes due to the polycrystalline and/or amorphous silicon carbide region(s) being formed on the masking layer.

As mentioned earlier, polycrystalline and/or amorphous silicon carbide regions can help to reduce stress.

Forming the silicon carbide seed regions may comprise depositing carbon on the exposed regions of the wafer and converting the carbon into silicon carbide, for example, by reaction of carbon with underlying silicon. Growing monocrystalline silicon carbide may comprise growing silicon carbide having a thickness of at least 0.5 µm, at least 1 µm, at least 2 µm or at least 5 µm. Growing silicon carbide may comprise growing silicon carbide having a thickness of no more than 2 µm, no more than 5 µm or no more than 10 µm. Growing the silicon carbide layers may comprise growing 3-step cubic silicon carbide.

The silicon wafer may have a diameter of at least 4 inches (101.6 mm) or 100 mm. The wafer may have a thickness of at least 500 µm. A silicon-on-insulator wafer can be used. The silicon wafer may include an epitaxially-grown silicon layer. The silicon wafer and/or epitaxially-grown silicon layer (if present) may be doped, for example, n-type or p-type.

The method may further comprise processing the silicon carbide layer to form semiconductor devices. The method may further comprise cutting the masking layer and the silicon wafer between the windows to form dies.

According to a second aspect of the present invention there is provided a silicon semiconductor structure comprising a monocrystalline silicon wafer having a principal surface and spaced apart monocrystalline silicon carbide layers disposed directly on the principal surface of the wafer.

Each monocrystalline silicon carbide layer may comprise a silicon carbide seed region formed directly on the principal surface of the silicon wafer and a silicon carbide layer disposed directly on the silicon carbide seed region.

The monocrystalline silicon carbide layers may comprise 3-step cubic silicon carbide.

The windows may have a first width ($w_1$) which is substantially larger than a second width ($w_2$) between the windows. The windows may have a width ($w_1$) and/or length ($l_1$) of at least 1 mm, at least 2 mm or at least 5 mm. The windows may have a width ($w_1$) and/or length ($l_1$) no more than 5 mm, no more than 10 mm or no more than 20 mm. The windows may have a width ($w_1$) and/or length ($l_1$) in a range between 5 mm and 20 mm. The windows may be separated by a width ($w_2$) no more than 500 µm or no more than 200 µm. The windows may be separated by a width ($w_2$) of about 100 µm.

The method may comprise forming a plurality of transistor within each window.

According to a third aspect of the present invention there is provided a method of forming a semiconductor die (or "completed semiconductor device", "final processed semiconductor device") including the method of forming monocrystalline silicon carbide on monocrystalline silicon. The semiconductor die may provide a discrete component or an integrated circuit.

According to a fourth aspect of the present invention there is provided a method comprising forming the semiconductor die and packaging the semiconductor die to form a packaged die (or "packaged chip").

According to a fifth aspect of the present invention there is provided a semiconductor device comprising a monocrystalline silicon substrate having a principal surface and a perimeter (or "edge"), the silicon substrate comprising an outer region running adjacent to the perimeter and an inner region disposed inside the outer region, a monocrystalline silicon carbide layer disposed directly on the principal surface of the substrate on the inner region, but not on the outer region of the substrate.

The monocrystalline silicon carbide layer may comprise a silicon carbide seed region formed directly on the principal surface of the silicon substrate and a silicon carbide layer disposed directly on the silicon carbide seed region.

The monocrystalline silicon carbide layer may comprise 3-step cubic silicon carbide.

Monocrystalline silicon carbide is preferably in direct contact with a substantial portion of the silicon substrate within the inner region. For example, monocrystalline silicon carbide may be in direct contact with at least 20%, at least 50% or at least 80% of the silicon substrate within the inner region.

The semiconductor device may include at least one vertical transistor, such as a vertical field effect transistor or vertical insulated gate bipolar transistor.

The semiconductor device may comprise a single transistor (for example a single power transistor) formed inside the inner region, i.e. a single transistor per die. The semiconductor device may comprise a plurality of transistors (for example, more than 4, at least 10, or at least 100, up to 1000 or more) formed inside the inner region.

The inner region may have a width and/or length in a range between 5 mm and 20 mm. The outer region may be separated by a width between the inner region and the perimeter of less than 500 µm or less than 100 µm. The width of the outer region may be about 50 µm.

BRIEF DESCRIPTION OF THE DRAWINGS

Certain embodiments of the present invention will now be described, by way of example, with reference to the accompanying drawings, in which:

FIG. 4a shows a first semiconductor device die formed by the method of fabrication shown in FIGS. 2a to 2j;

FIG. 4b shows a second semiconductor device die in which a masking layer is fully consumed; and FIG. 5 schematically illustrates a silicon carbide semiconductor device.

DETAILED DESCRIPTION

Before describing embodiments of the present invention, a silicon carbide/silicon heteroepitaxy process will be described with reference to FIGS. 1a to 1e which may be useful for understanding the present invention.

Figure 1:
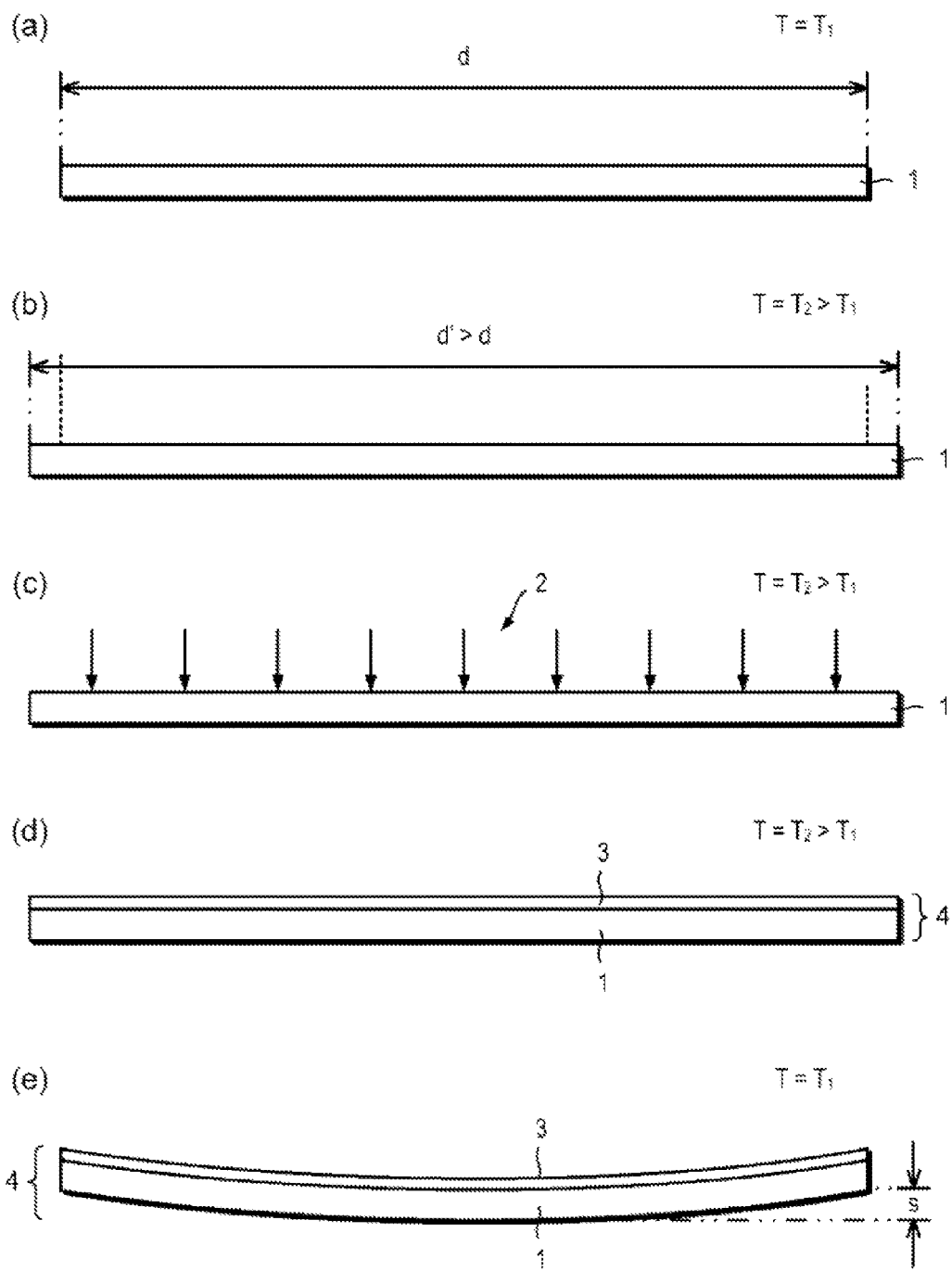
FIGS. 1a to 1e illustrates stages during a first process of heteroepitaxy.

FIG. 1a shows a monocrystalline silicon wafer 1 at a room temperature (about 25° C.). The silicon wafer 1 serves as a seed wafer on which a layer of three-step cubic silicon carbide (3C-SiC) can be epitaxially grown. The silicon wafer 1 has a diameter, d.

The silicon wafer 1 is placed in a silicon carbide epitaxial reactor (not shown) and is heated to about 1350° C. As shown (in highly schematic form) in FIG. 1b, the silicon wafer 1 expands when heated. The heated wafer has a diameter, d', greater than diameter, d, of the wafer at room temperature.

Referring to FIG. 1c, the heated silicon wafer 1 is exposed to a vapour 2 of silicon and carbon reactive species in a chemical vapour deposition (CVD) process. The vapour 2 adsorbs on the silicon wafer 1 forming three-step cubic silicon carbide. Although, the lattice constants of silicon carbide and silicon normally differ, an epitaxial layer 3 of three-step cubic silicon carbide grows on the silicon substrate 1 matching the lattice constant of silicon by means of lattice dislocations (not shown) and forming a composite structure 4, as shown in FIG. 1d.

However, as shown in FIG. 1e, when the composite structure 4 is allowed to cool, the silicon carbide epitaxial layer 3 shrinks at a faster rate than the underlying silicon wafer 3 and so the structure 4 bows.

For a silicon wafer 1 having a diameter of 150 mm, the edges of the wafer can be raised by a distance, s, relative to the centre of the wafer by about 10 mm.

The present invention seeks to address this problem.

Referring to FIGS. 2a to 2j and also to FIG. 3, an embodiment of a method of fabricating silicon carbide semiconductor devices which includes silicon carbide/silicon heteroepitaxy in accordance with the present invention will be described.

Figure 2:
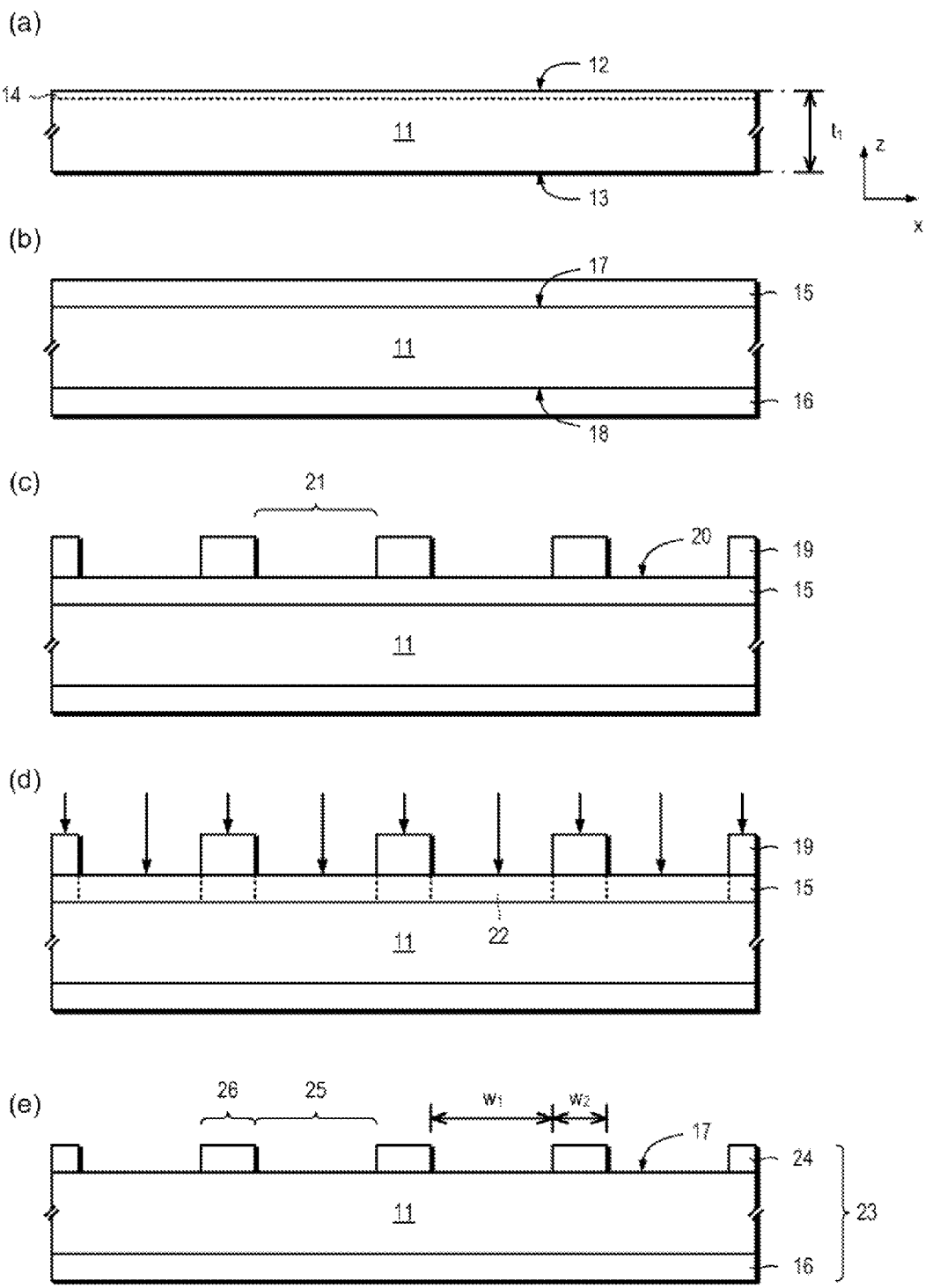
FIGS. 2a to 2j illustrate stages during a method of fabricating silicon carbide semiconductor devices including a second process of heteroepitaxy.
Figure 2:
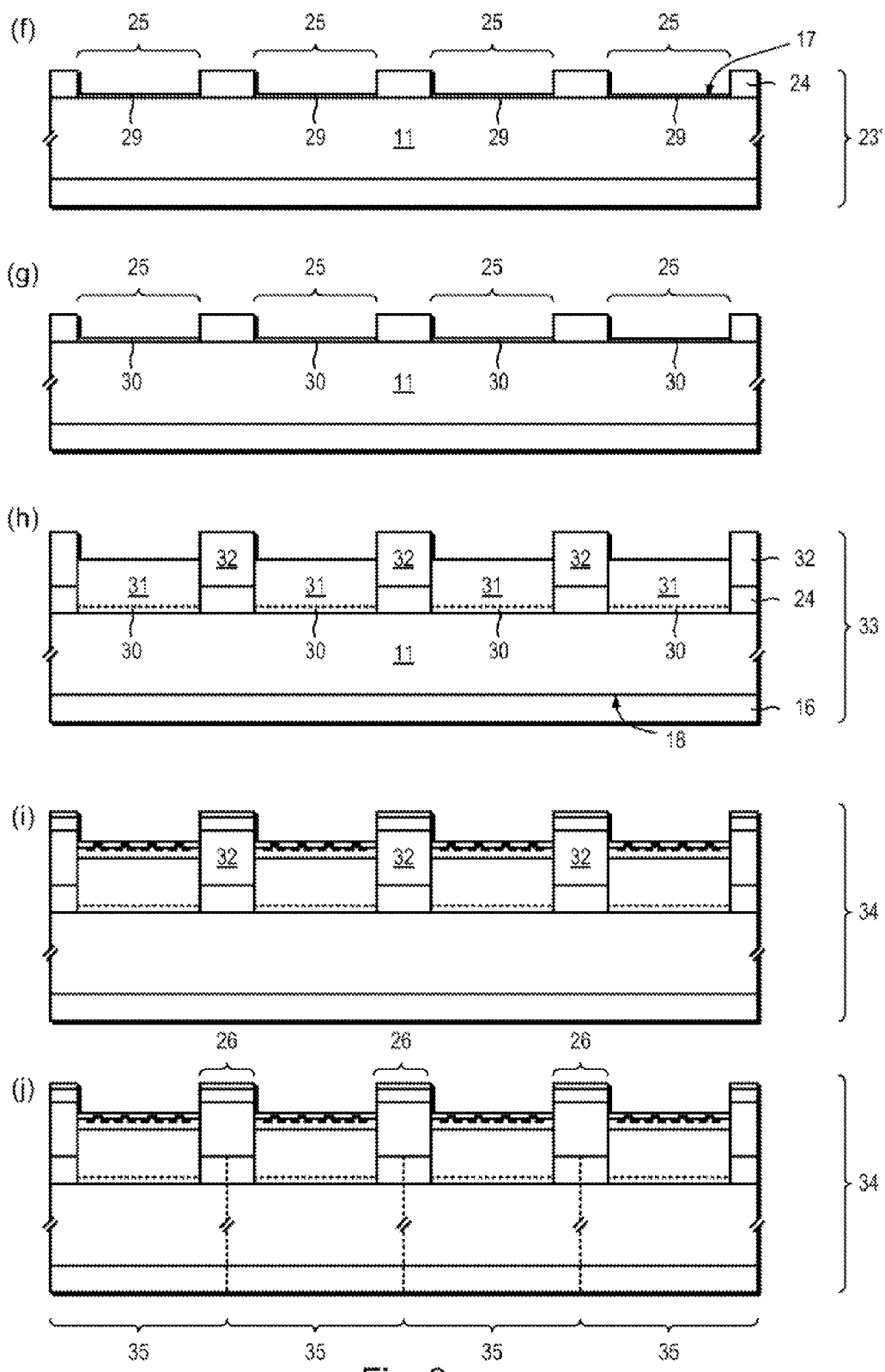
Figure 3:
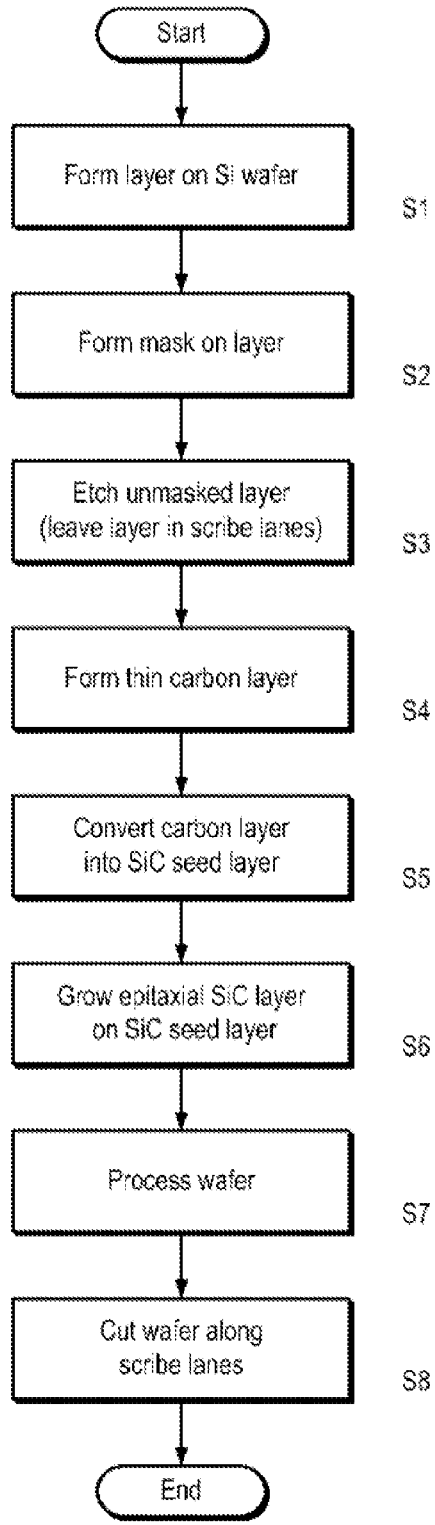
FIG. 3 is a flow diagram of a method of fabrication shown in FIGS. 2a to 2j.

FIG. 2a shows a monocrystalline silicon wafer 11 at a room temperature.

The silicon wafer 11 may have an off-axis, [111] crystal orientation and may be polished on one or both sides 12, 13. The sides 12, 13 may also be referred to as "surfaces" or "faces". Other crystal orientations may be used, such as [100] on or off axis. The silicon wafer 11 has a thickness, $t_1$, and a diameter, $d_1$ (not shown). In this example, $t_1$=500 μm and $d_1$=100 mm. The silicon wafer 11 has a wafer bow less than 25 μm and so can be considered to have substantially no bow.

The silicon wafer 11 serves as a crystal matrix on which a layer of monocrystalline three-step cubic silicon carbide can be epitaxially grown on a first side 12 of the wafer 11 (hereinafter referred to as the "upper surface") on a monocrystalline silicon surface region 14. In some embodiments, silicon-on-insulator may be used and so the monocrystalline silicon surface region 14 can take the form of a monocrystalline silicon layer, for example having a thickness of about 50 to 200 nm, disposed on a layer of silicon dioxide. However, other wafers having different layer structures, but which is mostly or predominantly comprised or made up of silicon can be used. For example, a wafer which mostly comprises silicon but which has one or a few layers of non-silicon material embedded in it may be used. Thus, the total thickness (or volume) of non-silicon material used in layers or regions of the wafer may make up no more about 1%, 0.1% or even 0.01% of the wafer.

Before heteroepitaxy, the silicon wafer 11 may be processed, for example, by patterning and etching the upper surface 12 and/or the lower surface 13.

Referring in particular to FIG. 2b, first and second masking layers 15, 16 are formed at the upper and lower surfaces 12, 13 (FIG. 2a) of the silicon wafer 11 (step S2).

The masking layers 15, 16 do not comprise monocrystalline silicon. The masking layers 15, 16 may comprise a dielectric material. However, a non-dielectric material (i.e. a semiconductor or conductive material) can be used. Moreover, silicon can be used, but in the form of polycrystalline silicon.

Each masking layer 15, 16 takes the form of a layer of thermal oxide and has a thickness of about 0.5 μm. The thermal oxide layers 15, 16 may be grown by wet oxidation at a temperature between about 800 and 1200° C. During thermal oxidation, silicon is sacrificially converted and so new first and second silicon surfaces 17, 18 are formed. Herein, the new first and second silicon surfaces 17, 18 are referred to as "principal surfaces".

Other dielectric materials, such silicon nitride ($Si_3N_4$), can be used. The layers 15, 16 can be formed using other processes, such as chemical vapour deposition (CVD). It will be appreciated that if the dielectric materials are deposited and silicon is not sacrificially consumed, then the (original) silicon surfaces 12, 13 form the principal surfaces 17, 18 of the wafer 11. The masking layers 15, 16 may each comprise two layers (i.e. may each be bilayers) comprising, for example, a silicon dioxide layer and an overlying silicon nitride layer. The masking layers 15, 16 need not be the same thickness and can be thinner or thicker. Suitable layer thicknesses can be found by routine experiment.

The presence of the second masking layer 16 can help to stiffen the wafer 11. Furthermore, the second masking layer 15 can help "balance" the first masking layer 15 in a way which helps reduce wafer bow during subsequent processing steps.

Referring to FIG. 2c, an etch mask 19 is formed on an upper layer 20 of the first masking layer 15. The etch mask 19 takes the form of a photoresist. The etch mask 19 takes the form of a rectangular grid defining an array of rectangular windows 21 which expose the upper surface 20 of the masking layer 15.

Referring in particular to FIG. 2d, unmasked regions 22 of the first masking layer 15 are etched so as to transfer the pattern of the etch mask 19 into the first masking layer 15 (step S3). The masking layer 15 may be etched using a dry etch, such as a reactive ion etch (RIE) based on, for example, CHF, or a wet etch using buffered hydrofluoric acid (BHF). After etching, the mask 19 is removed.

Referring in particular to FIG. 2e, the resulting patterned wafer 23 includes a silicon wafer 11 supporting a patterned masking layer 24 on the upper surface 17 of the wafer 11.

The masking layer 24 takes the form of a grid defining an array of windows 25 which expose the upper surface 17 of the wafer 11. The windows 25 are generally rectangular (e.g. square) having a width $w_1$ and (in an perpendicular direction) a length $l_1$ (not shown) in a range between about 5 mm to 20 mm. The windows 25 are spaced apart by strips 26 of masking layer material 24 having a width $w_2$ of about 100 μm which may later define scribe lanes.

The patterned wafer 23 is cleaned, e.g. using a Piranha etch, and is placed in a reactor (not shown), such as an ACiS M10 marketed by LPE S.p.A., Baranzate, Italy. The reactor chamber (not shown) is subjected to a high-vacuum bake out at about 500° C. and is re-filled with hydrogen at about 100 mbar. The patterned wafer 23 is heated via inductive heating of a susceptor (not shown).

The patterned wafer 23 may be cleaned in situ with hydrogen ($H_2$) at a temperature, $T_1$, of about 1100° C. for about 2 minutes.

The patterned wafer 23 is heated as quickly as possible to a temperature, $T_2$, of 1370° C. in a flow of a carbon-containing gas, such as ethylene ($C_2H_4$), diluted in hydrogen ($H_2$).

Referring in particular to FIG. 2f, during ramping, a thin (i.e. one, two or a few monolayers thickness) layers 29 of carbon are deposited directly on the upper surface 17 of the silicon wafer 11 in the windows 25. Carbon may also be deposited on the masking layer 24.

Referring also to FIG. 2g, the thin layers 29 (FIG. 2f) of carbon are converted into corresponding thin layers 30 of silicon carbide (SiC) by reacting the carbon with underlying silicon in the wafer 11 (step S5). The resulting thin silicon carbon layers 30 provide seed layers for subsequent deposition of silicon carbide.

The masking layer 24 may survive or may be consumed or partially-consumed by the hydrogen-rich atmosphere at the elevated temperatures.

During or after temperature ramping, the feed gases are changed from those used for carbonization to those used for silicon carbide epitaxy.

Referring to FIGS. 2h, silicon carbide is grown using a suitable silicon-carrying gas, such as trichlorosilane, $SiHCl_3$, and a suitable carbon-carrying gas, such as ethylene $C_2H_4$, at the elevated temperature, $T_2$, of 1370° C. resulting in layers 31 of monocrystalline 3-step cubic silicon carbide in the windows 25 and a layer 32 of polycrystalline, mixed polytype silicon carbide on the thermal oxide layer 24 (step S6). The carbon-carrying gas may be ethylene, propane ($C_3H_8$) or other similar gas. The silicon-carrying gas may a silane, such as (mono)silane ($SiH_4$), a chlorosilane, such as trichlorosilane, $SiHCl_3$, or another suitable silicon-carrying gas. Silicon carbide growth may be achieved using a more complex precursor gas which includes silicon and carbon.

As explained earlier, the masking layer 24 may be (partially or fully) consumed by the hydrogen-rich atmosphere. Even if the masking layer 24 does not survive, it can still serve to inhibit epitaxy (i.e. monocrystalline growth) of silicon carbide on the silicon wafer 11 in the regions between the windows 25. For example, deposition of silicon carbide may result in formation of polycrystalline silicon carbide on the silicon wafer 11 in the regions between the windows 25.

The silicon carbide layer 31 may be undoped (e.g. with a background doping of the order of $10^{14}$ cm$^{-3}$), lightly-doped or doped n-type with nitrogen (N) or phosphorus (P), or p-type with aluminium (Al) or Boron (B).

The reactor chamber (not shown) is purged and temperature is ramped down. When the processed wafer 33 cools, it does not bow (or at least bow excessively) because the thermal stresses only act over the dimensions of the window 25, not the whole wafer diameter. Furthermore, the epitaxial layers 31 and underlying silicon wafer 11 do not delaminate. The epitaxial layers 31 exhibit a low density of defects, for example, less than 100 mm$^{-2}$.

Without wishing to be bound by theory, the overgrown wafer 33 does not bow for one or more reasons. Firstly, forces caused by differences thermal expansion for silicon and silicon carbide act over smaller distances, i.e. windows 25, rather than over the whole wafer. Secondly, the presence of polycrystalline silicon carbide 32 can help to relax strain.

The silicon carbide layers 31 can be processed to form semiconductor devices, for example, power electronic devices or micro/nano electro-mechanical systems (MEMS/NEMS) devices.

Processing may include high-temperature processing steps such as gate oxidation, implant annealing etc. and low-temperature processing such as thin film deposition, lithography, dry etching and so on (step S7). A processed wafer 34 is shown in FIG. 2i.

As shown in FIG. 2j, after processing has been completed, the processed wafer 34 can be divided into dies 35 by cutting along the scribe lanes 26 (step S8).

The dies 35 are then packaged and wires bonded to the dies (not shown).

Referring to FIG. 4a, a die 35 includes a substrate 41 having a perimeter 42. The die 35 and the substrate 41 are rectangular in plan view (i.e. rectangular in the x-y plane). The substrate 41 includes inner, core portion 43 and an outer, annular portion 44. The outer portion 44 runs adjacent to the perimeter 43 of the substrate 41 and has an annular width of at least 50 μm, typically about 100 μm (i.e. about half a scribe lane width). Any silicon carbide 32' formed over the outer portion 44 of the substrate 41 is polycrystalline and/or amorphous. However, silicon carbide 31 formed on the inner portion 43 of the substrate 41 is monocrystalline.

As explained earlier, the masking layer 24 may be etched during ramping, carbonizing, C-to-SiC converting and/or SiC growing stages.

Referring to FIG. 4b, a die 35 is shown in which polycrystalline and/or amorphous silicon carbide 32' is formed directly on the outer portion 44 of the substrate 41. Thus, monocrystalline and polycrystalline and/or amorphous silicon carbide is formed in the same layer 45, but an inner region 31 of the layer 45 is monocrystalline and an outer, annular region 32' is polycrystalline and/or amorphous. Thus, the monocrystalline and polycrystalline carbide regions are laterally spaced.

Referring to FIG. 5, an example of a semiconductor device 51 in the form of a insulated gate bipolar transistor (IGBT) is shown.

The device 51 has first and second 3-step cubic silicon carbide epitaxial layers 52a, 52b grown using the process hereinbefore described. The silicon carbide epitaxial layers 52a, 52b include a heavily-doped p-type layer 52a which is supported on a p-type silicon substrate 53 and which provides a p-type collector, and a lightly-doped n-type layer 52b which provides a drift region and which is supported on the p-type silicon carbide layer 52a. P-type wells 54 at the surface 55 of the epitaxial layer 52 provide body regions 54. N-type wells 56 within the p-type wells 54 provide contact regions. A channel 57 is formed beneath a gate 58 which separated using a gate dielectric layer 59.

The IGBT shown in FIG. 5 is able to support much greater breakdown voltages due to the use of silicon carbide in the epitaxial drift region 31.

It will be appreciated that many modifications may be made to the embodiments hereinbefore described.

Different wafer diameters and thicknesses can be used. For example, wafers having diameters of 150 mm, 200 mm, 300 mm or more can be used.

The growth conditions, for instance temperature, pressure and/or precursors, can be varied and optimised.

A material other than silicon can be used for the seed wafer. Thus, wafers made up of (or predominantly of) an inorganic semiconductor can be used.

The process need not involve growing a monocrystalline layer of semiconductor material (i.e. heteroepitaxy), but can involve growing non-monocrystalline layers, e.g. polycrystalline layers of semiconductor material.

An upper surface or face of a wafer may be referred to as a "front surface", "front face", "top surface" or "top face" of the wafer. Likewise, a lower surface or face may be referred to a "back surface", "rear surface", "back face", "rear face", "bottom surface", "bottom face" of the wafer.

The invention claimed is:

1. A method, comprising:
   providing a monocrystalline silicon wafer having a principal surface which supports a masking layer having windows which expose corresponding regions of the silicon wafer;
   forming silicon carbide seed regions on the exposed regions of the wafer;
   consuming fully the masking layer at an elevated temperature;
   growing monocrystalline silicon carbide on the silicon carbide seed regions; and forming regions of polycrystalline and/or amorphous silicon carbide between the monocrystalline silicon carbide layers on the silicon wafer.

2. A method according to claim 1, wherein providing the silicon wafer having a principal surface which supports a masking layer comprises:
   providing an monocrystalline silicon wafer;
   forming a masking layer on the silicon wafer, the masking layer directly overlying a principal layer;
   providing an etch mask having windows on the masking layer; and
   etching the masking layer through the windows in the etch mask to reach the principal surface of the wafer.

3. A method according to claim 1, wherein the masking layer is a layer of dielectric material, and optionally the masking layer is a silicon dioxide layer, and optionally forming the silicon dioxide layer is a thermal oxide layer.

4. A method according to claim 1, wherein the masking layer is a layer of semiconductor or conductive material, or wherein the masking layer is a layer of polycrystalline silicon.

5. A method according to claim 1, wherein:
   the masking layer comprises a bilayer comprising first and second bilayer layers, and/or the masking layer has a thickness in a range between 2,000 and 10,000 Å, and/or the masking layer has a thickness in a range between 4,000 and 6,000 Å.

6. A method according to claim 1, wherein the principal surface is a first principle surface and the masking layer is a first masking layer and the silicon wafer has a second, opposite principal surface which supports a second masking layer, and optionally the first masking layer and the second masking layer comprise the same material.

7. A method according to claim 1, wherein forming the silicon carbide seed regions comprises:
   depositing carbon on the exposed regions of the wafer; and
   converting the carbon into silicon carbide.

8. A method according to claim 1, wherein:
   growing the silicon carbide comprises growing silicon carbide having a thickness of at least 0.5 µm, optionally at least 1 µm, optionally at least 2 µm and/or optionally at least 5 µm, and/or growing the silicon carbide layers comprises growing silicon carbide having a thickness of no more than 5 µm or no more than 10 µm, and/or growing the silicon carbide layers comprises growing 3-step cubic silicon carbide.

9. A method according to claim 1, wherein the wafer has a diameter of at least 4 inches (101.6 mm) or 100 mm, and/or the wafer has a thickness of at least 500 µm.

10. A method according to claim 1, further comprising:
    processing the silicon carbide to form semiconductor devices, and/or cutting the masking layer and the silicon wafer between the windows to form dies.

11. A method according to claim 1, wherein:
    the windows have a first width which is substantially larger than a second width between the windows, and/or the windows have a width and/or length in a range between 5 mm and 20 mm, and/or the windows are separated by a width of less than 1 mm, less than 500 µm or less than 200 µm, and/or the windows are separated by a width of about 100 µm.

12. A method of forming a semiconductor die including a method according to claim 1.

13. A method comprising:
    forming a semiconductor die according to claim 12; and
    packaging the semiconductor die.

14. A silicon semiconductor structure comprising:
    a monocrystalline silicon wafer having a principal surface; and
    monocrystalline silicon carbide layers disposed directly on the principal surface of the wafer, wherein each monocrystalline silicon carbide layer is spaced apart from one another on the principal surface of the wafer; and
    polycrystalline and/or amorphous silicon carbide layer(s) disposed between the silicon carbide layers directly on the principal surface of the wafer without a masking layer supported on the principal surface of the silicon wafer.

15. A semiconductor structure according to claim 14, wherein each silicon carbide layer comprises:
    a silicon carbide seed region formed directly on the principal surface of the silicon wafer; and
    a monocrystalline silicon carbide layer disposed directly on the silicon carbide seed region, and/or wherein the silicon carbide layers comprise 3-step cubic silicon carbide.

16. A semiconductor structure according to claim 14, wherein polycrystalline and monocrystalline silicon carbide layers are optionally formed in different regions of a single silicon carbide layer.

17. A semiconductor device comprising:
    a monocrystalline silicon substrate having a principal surface and a perimeter, the silicon substrate comprising an outer, annular region running adjacent to the perimeter of the substrate and an inner region disposed inside the outer region;
    a monocrystalline silicon carbide layer disposed directly on the principal surface of the substrate on the inner region but not on or over the outer region of the substrate; and
    a polycrystalline and/or amorphous silicon carbide layer disposed on the outer region but not on the inner region;
    wherein the polycrystalline and/or amorphous silicon carbide layer(s) is disposed directly on the silicon substrate without a masking layer supported on the principal surface of the silicon wafer.

18. A semiconductor device according to claim 17, wherein the silicon carbide layer comprises:
    a monocrystalline silicon carbide seed region formed directly on the principal surface of the silicon substrate; and
    a monocrystalline silicon carbide layer disposed directly on the silicon carbide seed region, and/or the silicon carbide layer comprises 3-step cubic silicon carbide.

19. A semiconductor device according to claim 17, further comprising:
    a polycrystalline silicon carbide layer disposed on the outer region but not on the inner region, and wherein polycrystalline monocrystalline silicon carbide layers are optionally formed in different regions of a single silicon carbide layer.

20. A semiconductor device according to claim 17, wherein the inner region has a width and/or length in a range between 5 mm and 20 mm.

21. A method according to claim 1, wherein the windows have a width and/or length about 2.5 mm.

22. A method according to claim 1, wherein the elevated temperature is about 1350° C.

23. A method according to claim 1, wherein the polycrystalline and/or amorphous silicon carbide layer reduces bow in a composite wafer comprising the monocrystalline silicon wafer and the monocrystalline silicon carbide grown on the monocrystalline silicon wafer.

24. A semiconductor device according to claim 17, wherein the polycrystalline and/or amorphous silicon carbide layer is configured to reduce bow in the semiconductor device.

\* \* \* \* \*